US008937564B2

(12) United States Patent
Aloni et al.

(10) Patent No.: US 8,937,564 B2
(45) Date of Patent: Jan. 20, 2015

(54) SYSTEM, METHOD AND NON-TRANSITORY COMPUTER READABLE MEDIUM FOR COMPRESSING GENETIC INFORMATION

(71) Applicants: Dan Aloni, Tel Aviv (IL); Jacob Brodio, Tel Aviv (IL); Kariel Sandler, Bat Hefer (IL); Cyril Plisko, Petah Tikvah (IL); Alexander Goldberg, Rehovot (IL)

(72) Inventors: Dan Aloni, Tel Aviv (IL); Jacob Brodio, Tel Aviv (IL); Kariel Sandler, Bat Hefer (IL); Cyril Plisko, Petah Tikvah (IL); Alexander Goldberg, Rehovot (IL)

(73) Assignee: Infinidat Ltd., Herzliya (IL)

( * ) Notice: Subject to any disclaimer, the term of this patent is extended or adjusted under 35 U.S.C. 154(b) by 0 days.

(21) Appl. No.: 13/738,092

(22) Filed: Jan. 10, 2013

(65) Prior Publication Data
US 2014/0232574 A1     Aug. 21, 2014

(51) Int. Cl.
*H03M 7/00*     (2006.01)
*H03M 7/42*     (2006.01)
(52) U.S. Cl.
CPC ........................................ *H03M 7/42* (2013.01)
USPC .............................................. 341/106; 341/51

(58) Field of Classification Search
CPC .... H03M 7/42; C12Q 2563/185; C12N 15/11
USPC ........................................ 341/50, 106, 67, 51
See application file for complete search history.

(56) References Cited

U.S. PATENT DOCUMENTS

| 7,667,091 B2 * | 2/2010 | Gleba et al. ..................... 800/21 |
| 2004/0148302 A1 | 7/2004 | McKay et al. |
| 2004/0153255 A1 * | 8/2004 | Ahn ................................. 702/20 |
| 2004/0191788 A1 | 9/2004 | Gleba et al. |
| 2008/0268431 A1 * | 10/2008 | Choy et al. ........................ 435/6 |
| 2012/0089652 A1 * | 4/2012 | Ganeshalingam et al. ... 707/825 |
| 2012/0102041 A1 | 4/2012 | Park et al. |
| 2013/0031092 A1 | 1/2013 | Bhola |
| 2013/0253839 A1 | 9/2013 | Friedlander et al. |
| 2013/0304391 A1 | 11/2013 | Cardonha et al. |
| 2014/0074904 A1 | 3/2014 | Givelberg et al. |
| 2014/0214780 A1 | 7/2014 | Lange et al. |

* cited by examiner

*Primary Examiner* — Peguy Jean Pierre
(74) *Attorney, Agent, or Firm* — Oren Reches

(57) ABSTRACT

A method for compressing information by a computerized system, the method may include receiving a mixture of DNA data and additional information; and compressing the DNA data to provide compressed DNA data, wherein the compressing comprises encoding the DNA data by using a predefined codeword dictionary that was constructed based upon reference DNA data.

32 Claims, 11 Drawing Sheets

```
┌─────────────────────────────────────────────────────────────────┐
│ Receiving one or more predefined codeword dictionaries or       │
│ calculating one or more predefined codeword dictionaries. The   │
│ main storage system or other secondary storage system may       │
│ provide the one or more predefined codeword dictionaries. 807   │
└─────────────────────────────────────────────────────────────────┘
                                │
                                ▼
┌─────────────────────────────────────────────────────────────────┐
│ Receiving, by a secondary storage system, a compressed genetic  │
│ information database using direct coupling and/or physical      │
│ media. 810                                                      │
└─────────────────────────────────────────────────────────────────┘
                                │
                                ▼
┌─────────────────────────────────────────────────────────────────┐
│ Decompressing the compressed genetic information database to    │
│ provide a vast genetic information database. 820                │
└─────────────────────────────────────────────────────────────────┘
                                │
                                ▼
┌─────────────────────────────────────────────────────────────────┐
│ Receiving, by the secondary storage system, differences between │
│ different point in time snapshots of the compressed genetic     │
│ information database. 830                                       │
└─────────────────────────────────────────────────────────────────┘
                                │
                                ▼
┌─────────────────────────────────────────────────────────────────┐
│ Decompressing the differences to reconstruct updates to the     │
│ vast genetic information database. 840                          │
└─────────────────────────────────────────────────────────────────┘
                                │
                                ▼
┌─────────────────────────────────────────────────────────────────┐
│ Updating the vast genetic information database with the         │
│ updates. 850                                                    │
└─────────────────────────────────────────────────────────────────┘
                                │
                                ▼
┌─────────────────────────────────────────────────────────────────┐
│ Receiving a request from a user to provide a portion of the     │
│ vast genetic information database. 860                          │
└─────────────────────────────────────────────────────────────────┘
                                │
                                ▼
┌─────────────────────────────────────────────────────────────────┐
│ Providing to the user the portion of the vast genetic           │
│ information database. 870                                       │
└─────────────────────────────────────────────────────────────────┘

SYSTEM, METHOD AND NON-TRANSITORY COMPUTER READABLE MEDIUM FOR COMPRESSING GENETIC INFORMATION

BACKGROUND

DNA

There are five animal kingdoms, each animal kingdom may include phylum (for example—Chordata, Artropoda and Mollisca), each phylum may include classes (such as Mammalia, Ayes, Reptilia and Amphibia, each class may include orders (the class Mammalia may include Primares, Carnivora, Rodentia and Perissodactyla), each order includes families (the order Carnivora may include Canidae, Felidae, Ursidae, Hyaenidae and Mustelidae), each family includes genus and each genus includes species.

Each member of each species carries genetic information. The Deoxyribonucleic acid (DNA) molecule is the molecule that encodes the genetic information.

DNA is made of four nucleotides—adenine (A), cytosine (C), guanine (G) and thymine (T).

A DNA molecule can be represented by a succession of letters (each letter out of A, C, G and T may represent a nucleotides basis while letters such as N may represent ambiguity). These letters indicate the order of nucleotides within a DNA molecule.

The extraction of the nucleotides from a living tissue is known as sequencing and is very complex. A complete genomic sequence of a member of a species (for example—one person) can be found by sequencing that person's DNA one or more times.

Scientists usually process, retrieve or review DNA fragments of the complete genomic sequence. A DNA fragment may be represented by a DNA fragment string that include letters A,C,G,T and optionally ambiguity representative letters such as N.

A sequence of letters that represents the complete genomic sequence of the person can be about 2 terabyte long.

The 1000 genomes project

The 1000 genomes project (www.1000.genomes.org) sequences the genomes of a large number of people, to provide a comprehensive resource on human genetic variation. The goal of the 1000 genomes project is to find most genetic variants that have frequencies of at least 1% in the populations studied. This goal can be attained by sequencing many persons.

The 1000 genomes project maintains a vast genetic information database that exceeds 200 Terabytes. Due to its vast size, scientists are able to retrieve only to very small portions of that vast genetic information database, and do not benefit from the wealth of genetic data included in the vast genetic information database.

The 1000 genomes project also releases genetic information database updates that are hard to manage.

There is a growing need to provide a system and method for allowing access to vast genetic information databases and simplify the updates of the vast genetic information database.

SUMMARY

According to an embodiment of the invention a method may be provided for compressing and storing information, the method may include compressing compressible data by an encoder of a storage system by applying a predefined codeword dictionary that was constructed based upon reference data that is expected to be statistically similar to the compressed data.

The method may include receiving by a storage system, a mixture that comprises the compressible data and additional information and extracting the compressible data.

According to an embodiment of the invention there may be provided a method for compressing information by a computerized system, the method may include receiving a mixture of DNA data and additional information; and compressing the DNA data to provide compressed DNA data. The compressing may include encoding the DNA data by using a predefined codeword dictionary that was constructed based upon reference DNA data.

The method may include selecting, out of multiple predefined codeword dictionaries, the predefined codeword dictionary to be used for compressing the DNA data based upon an expected resemblance between the DNA data and the reference DNA data.

The method may include selecting out of multiple predefined codeword dictionaries the predefined codeword dictionary, wherein the selecting may include finding the predefined codeword dictionary that is expected to provide a best match to the DNA data.

The method may include storing the compressed DNA data at a storage system.

The method may include generating location information indicative of a location of DNA data elements and additional information elements within the mixture.

The method may include processing the location information by applying at least one out of error correction encoding, error detection encoding and compression to provide processed location information; and storing the location information at a storage module of a storage system.

The method may include extracting the DNA data from the mixture by searching for DNA fragment strings.

The mixture may include multiple information strings and the method may include concatenating DNA fragment strings from the multiple information strings to provide the DNA data.

The method may include concatenating DNA fragment strings from at least 100 or 1000 information strings.

The DNA data may relate to a first species and the reference DNA data may relate to a second species. The first species may differ from the second species. The first and second species may belong to a same family. The first and second species may belong to a same genus. The first and second species may belong to a same order.

The DNA sequence of the first specie may be expected to differ from a DNA sequence of the second sequence by less than a predetermined similarity threshold.

The compressing may include finding a certain DNA fragment string that does not match any codeword of the predefined codeword dictionary and calculating a certain new codeword representative of the certain DNA fragment string.

The method may include including the certain new codeword in the DNA data.

The method may include comparing a length of the certain DNA fragment string to a length of the certain new codeword and including in the DNA data only a shorter element out of the certain DNA fragment string and the certain new codeword.

The method may include updating the predefined codeword dictionary by adding the certain new codeword.

The method may include updating the predefined codeword dictionary by adding the certain new codeword if the certain new codeword is shorter than the certain DNA fragment string and preventing an addition of the certain new codeword if the certain new codeword is longer than the certain DNA fragment string.

The method may include replacing the predefined codeword dictionary by another predefined codeword dictionary and storing at a storage system the predefined codeword dictionary and the other predefined codeword dictionary.

The method may include comparing compression performances of a plurality of predefined codeword dictionaries, and determining to replace the predefined codeword dictionary by another predefined codeword dictionary if it is determined that the other predefined dictionary exhibits better compression performances than the predefined codeword dictionary.

The method may include comparing compression ratios obtained by applying different predefined codeword dictionaries and selecting a predefined codeword dictionary that exhibits a best compression ratio.

The method may include storing at a storage system the compressed DNA data, the additional information and location information indicative of a location of DNA data elements and additional information elements within the mixture.

The method may include storing at least one of the additional information and the location information at a first logical address space and storing the compressed DNA data at a second logical address space.

The method may include storing the additional information, the location information and the compressed DNA data at different logical address spaces.

The method may include storing the additional information, the location information and the compressed DNA data at proximate logical address spaces.

The method may include receiving a request to retrieve the mixture; decrypting the compressed DNA data to provide the DNA data; and reconstructing the mixture by using the location information.

Further embodiments of the invention include a computer readable medium that is non-transitory and may store instructions for performing the above-described methods and any steps thereof, including any combinations of same. For example, the computer readable medium may store instructions to be executed by a computerized system for: receiving a mixture of DNA data and additional information; and compressing the DNA data to provide compressed DNA data, wherein the compressing comprises encoding the DNA data by using a predefined codeword dictionary that was constructed based upon reference DNA data.

Additional embodiments of the invention include a system arranged to execute any or all of the methods described above, including any stages- and any combinations of same. For example, the system may include a communication module arranged to for receive a mixture of DNA data and additional information; and a genetic data processor arranged to compress the DNA data to provide compressed DNA, wherein the compressing comprises encoding the DNA data by using a predefined codeword dictionary that was constructed based upon reference DNA data.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 8 illustrates a method according to an embodiment of the invention;

Figure 1A:
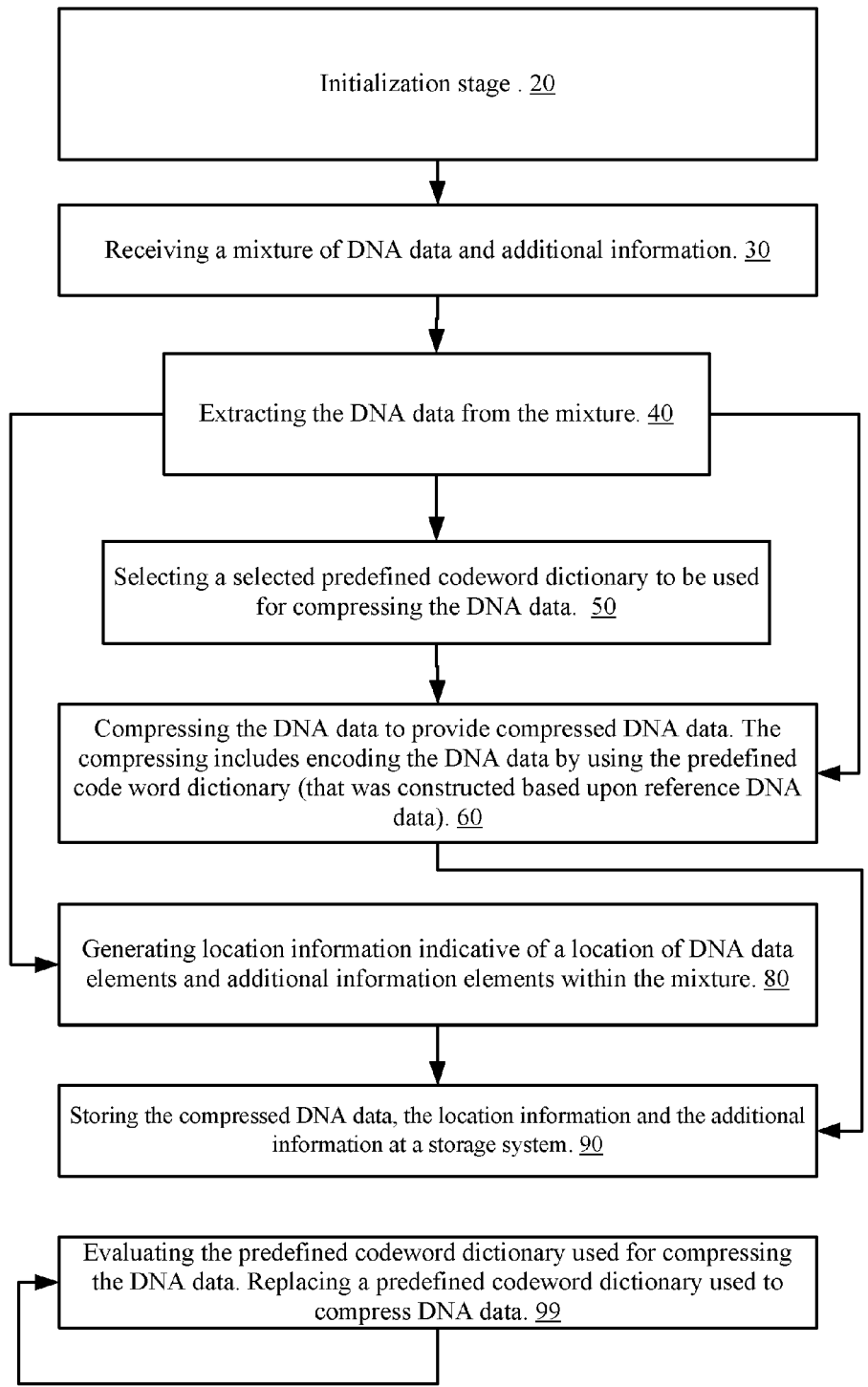
FIG. 1A illustrates a method according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Compressing DNA Data from a Mixture

FIG. 1A illustrates method 10 according to an embodiment of the invention.

Method 10 may start by initialization stage 20.

Initialization stage 20 may include receiving or generating one or more predefined codeword dictionaries. Each predefined codeword dictionary is constructed based upon reference DNA data.

The generation of the predefined codeword dictionary can be done by applying any known codeword dictionary building methods known in the art. According to an embodiment of the invention encoding algorithms that are used to generate dictionaries "on the fly" can be used in an off-line manner to generate the predefined codeword dictionaries.

The predefined codeword dictionary can be built using a variable length codeword algorithm, a fixed length codeword algorithm or a combination thereof. Non-limiting examples of such algorithms include Huffman algorithm and Lempel-Ziv algorithm that is used in an off-line manner (instead of on-line manner) in order to build the predefined codeword dictionary.

According to an embodiment of the invention the building may include: linearly traversing reference DNA data, each time extending a lookup table that is the predefined codeword dictionary, adding codewords of variable length (for example adding words of varying power of two lengths from offsets that are multiplies of powers of two). If a codeword is in the predefined codeword dictionary all of its prefixes (word portions) may also be in the predefined codeword dictionary. In contrary to the Lempel-Ziv algorithm the building process may not be responsive to the number of times a prefix appears in the predefined codeword dictionary but it may be depend on offsets. The predefined codeword dictionary can be a mutable tree.

The predefined codeword dictionary is predefined in a sense that at least some codewords (for example—most or all of the codewords) of the dictionary are calculated before the predefined codeword dictionary is used to compress DNA data. The predefined codeword dictionary can be updated over time.

Different predefined codeword dictionaries may be constructed using different reference DNA data. Reference DNA data that is used to construct different predefined codeword dictionaries can overlap, partially overlap or not overlap.

Different predefined codeword dictionaries can differ from each other by the manner that the reference DNA is processed.

Different predefined codeword dictionaries can be constructed based upon reference DNA data relating to different members of the same species, reference DNA data of different species, reference DNA data of different families, reference DNA data of different genus and even reference DNA of different orders.

Stage 20 may be followed by stage 30 of receiving a mixture of DNA data and additional information.

Figure 2:
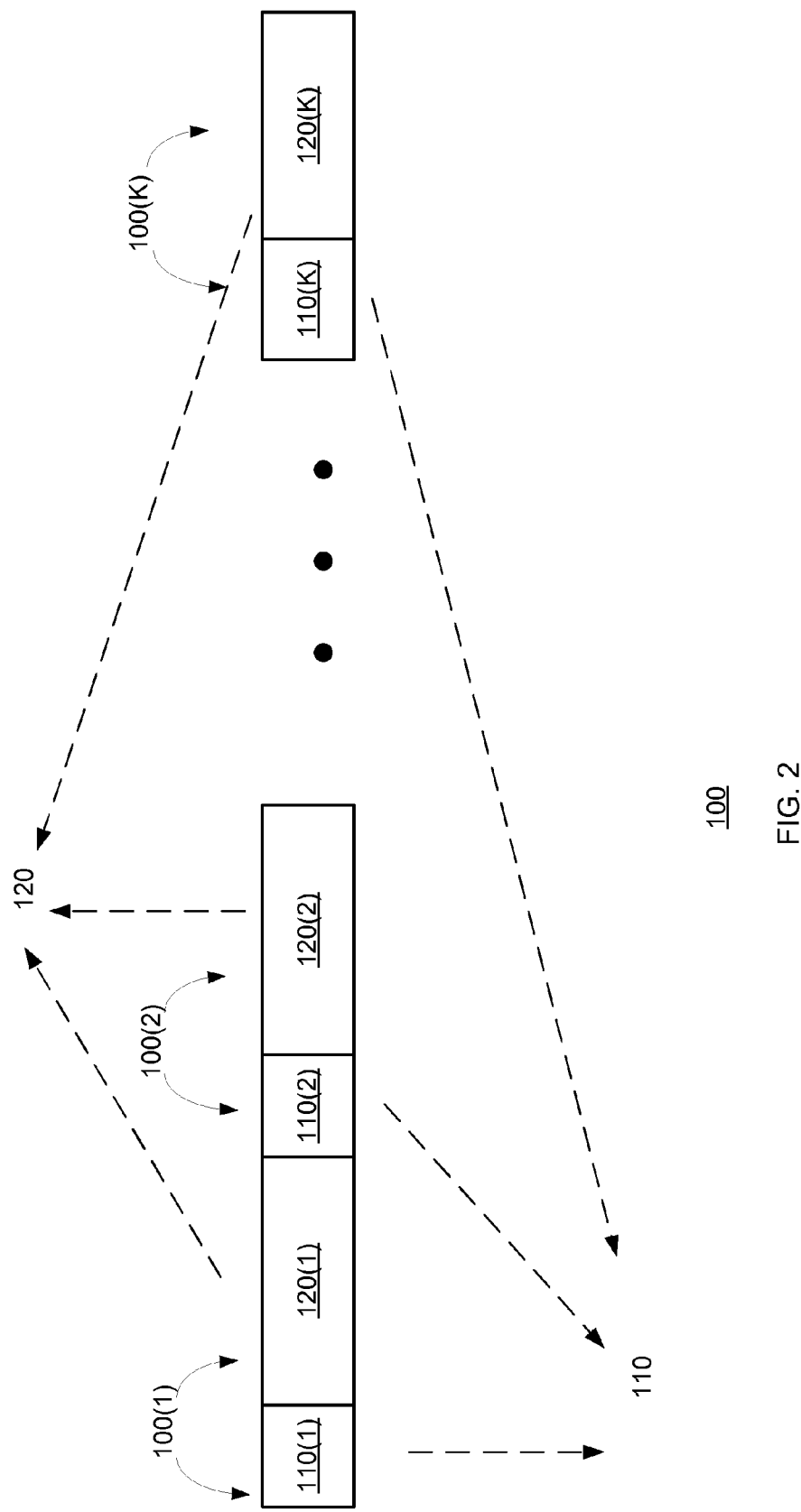
FIG. 2 illustrates a mixture of DNA data and additional information according to an embodiment of the invention.

A non-limiting example of such DNA data is provided in FIG. 2.

FIG. 2 illustrates a mixture 100 of DNA data 110 and additional information 120 according to an embodiment of the invention.

The mixture 100 is illustrated as including multiple information strings 100(1)-100(K), and each of these information strings may include DNA data portions such as DNA fragment strings 110(1)-110(K) and additional information portions 120(1)-120(K). K being a positive integer. It is noted that the number of DNA data portions may differ from the number of additional information portions.

DNA fragment strings 110(1)-110(K) form DNA data 110 and additional information portions 120(1)-120(K) form additional information 120.

Another non-limiting example of a mixture of information is provided in the table below. The table format is provided merely to assist in pointing to different parts of the mixture. The right column includes the mixture while the left column includes the serial number of rows of the table. Actually the mixture may form a string of symbols. Furthermore—the partition of the mixture to rows is merely provided as an example.

The even rows of the table include DNA fragment strings. These DNA fragment strings can be concatenated to provide DNA data that is compressed in unison. It is noted that the table also illustrates multiple information strings. Each information strings may include DNA data and additional information. The additional information can precede the DNA data or follow the DNA data. For example, rows 1 and 2 of the table can form an information string. Yet for another example, rows 1 and 2 as well as the first two lines of row 3 may form an information string. Yet for a further example—rows 2 and 3 can form an information string.

```
1  @ERR013136.16 IL24_4662:1:1:1078:2800/1

2  CTATGCTTTGTCCTGCTCCTCCTACCCAGACGTTGCAACANNNNNNNNN
   NNNTTGGACTCTCNNNNNNNNNNNNNNNTGGCNNNNNNNNNNNNNNNN
   NNNNNNNNNNNNNNC

3  +GGGGEB@EDF=?C@BGG?AGGGGGG9=DE@;>:?A:>8><!!!!!!!!!!!-
   2333393:3!!!!!!!!!!!!!!!:21+!!!!!!!!!!!!!!!!!!!!!!!!!,
   @ERR013136.17 IL24_4662:1:1:1078:5719/1

4  AAACTATAATCCTCCAAGTTAGATTCACACCTAATCTAGTNNNNNNNNN
   NNNTTCTCAGAGGNNNNNNNNNNNNNNNNAGTTNNNNNNNNNNNNNNN
   NNNNNNNNNNNNNNC

5  +BBED@DC<?EEEEEED=>D@BE??B??9922557<658=5!!!!!!!!!!!!6223(44262!
   !!!!!!!!!!!!!!!2315!!!!!!!!!!!!!!!!!!!!!!!!!!!!!%
   @ERR013136.18 IL24_4662:1:1:1078:16663/1

6  TTTGAGACTGACTTCTGACATAATCTATAGTCCAAAATCTNNNNNNNNN
   NNNATGAAGACCTNNNNNNNNNNNNNNNNTTTCNNNNNNNNNNNNNNN
   NNNNNNNNNNNNNNG

7  +DBBB5?B7D?=EFFCF997:E9:E6B2B7B==??=A@8@@!!!!!!!!!!!!796579779-
   !!!!!!!!!!!!!!83(-!!!!!!!!!!!!!!!!!!!!!!!!!!!!)
   @ERR013136.19 IL24_4662:1:1:1079:18570/1

8  AATTTACAAGAAAAAATTAAACCACCCATCGAAAACTGGGNNNNNNNNN
   NNNGAACACTTTTCNNNNNNNNNNNNNNNNTGCANNNNNNNNNNNNNN
   NNNNNNNNNNNNNNA
```

-continued

9  BB211<CC81979;>?52A?CAE@E<AA5>5<79990221!!!!!!!!!!344:45//113!!!!!!!!!
   !!!!!!!$+43!!!!!!!!!!!!!!!!!!!!!!!!!!!'
   @ERR013136.20 IL24_4662:1:1:1079:6930/1

10 GGAATATTTGTTGGGGATGAAAAAGAGATCTAAATGTGTCNNNNNNNN
   NNNNAGCCTGACTGNNNNNNNNNNNNNNNTATGNNNNNNNNNNNNNNN
   NNNNNNNNNNNNNNNT

11 +AA<9?1AB<BE?D?EB5AB@88/898?:?A=;6==8383:!!!!!!!!!!!!,333-
   4552<!!!!!!!!!!!!!!!-111!!!!!!!!!!!!!!!!!!!!!!!!!!!$
   @ERR013136.21 IL24_4662:1:1:1079:15224/1

12 TGAATCACAACAGAAAATGGAAGAGAAAACATAACTTCCTNNNNNNN
   NNNTCATGGGCACANNNNNNNNNNNNNNNNGAAGNNNNNNNNNNNNNN
   NNNNNNNNNNNNNNT

13 +B9BA7A>>B<C?CA/>B;;2B@-:;BAC@BB>,?B66<A-
   !!!!!!!!!!!.:5,323355.!!!!!!!!!!!!!!!!,322!!!!!!!!!!!!!!!!!!!!!!!!!%
   @ERR013136.22 IL24_4662:1:1:1079:4515/1

14 TACTCATTAATATTGAATTACTATAATTAATATTATGATANNNNNNNN
   NNGATAGAATGATNNNNNNNNNNNNNNNNNATTCNNNNNNNNNNNNNNN
   NNNNNNNNNNNNNNC

15 +@CFFEFBB;EEAFDEEBECE;@CEBE?DEB@FEA>67954!!!!!!!!!!!108123588
   63!!!!!!!!!!!!!!!.223!!!!!!!!!!!!!!!!!!!!!!!!!!!!1
   @ERR013136.23 IL24_4662:1:1:1079:10597/1

16 CGGGTGTGGTGGCGGGTGCCTGTAGTCCCAGCTACTCGGGNNNNNNNN
   NNAGGAGAATGGCNNNNNNNNNNNNNNNNCGAGNNNNNNNNNNNNNNN
   NNNNNNNNNNNNNG

17 +>>>>4>5>>9>><<<9410/7.415++,23&2/'4474455!!!!!!!!!!'/22)(1*/2'!!!!!!!!!!!!!!!!
   %1+1!!!!!!!!!!!!!!!!!!!!!!!!!!4
   @ERR013136.24 IL24_4662:1:1:1079:16734/1

18 AAAGACCATGCTTTAGGATTGCACCACATTGTTTCAACACNNNNNNNN
   NNGAAGAACATTTNNNNNNNNNNNNNNNNAAATNNNNNNNNNNNNNNN
   NNNNNNNNNNNNNNT

19 +EC=99?E?7;E858@:6=449E@?C??773620?7:<87!!!!!!!!!!!-
   4416579233!!!!!!!!!!!!!!!!14/1!!!!!!!!!!!!!!!!!!!!!!!!!!!$
   @ERR013136.25 IL24_4662:1:1:1080:9737/1

20 AACCAACCAACAATAACCACCAAAAGTATATTAAACAAGTANNNNNNN
   NNNTAAGAATACATNNNNNNNNNNNNNNNNTGTGNNNNNNNNNNNNNN
   NNNNNNNNNNNNNNA

21 @ERR013136.26 IL24_4662:1:1:1080:17981/1

22 ATAAAAATTAACAAGTGAAGAGAAAACATGTGGAATAGGAGNNNNNNN
   NNNGTAAACTATGCNNNNNNNNNNNNNNNAATANNNNNNNNNNNNNNN
   NNNNNNNNNNNNNNC

23 +D:DBAA743CCC@>667?;5<7??<:7>35.44;:3>4382!!!!!!!!!!*.65590<143!!!!!!!!!!
   !!!!!!23,1!!!!!!!!!!!!!!!!!!!!!!!!!=
   @ERR013136.27 IL24_4662:1:1:1080:19595/1

24 CCAAAAAACTAAAGGAAAAAGCCATGTTTAAAAAAGTACAANNNNNNN
   NNNATAACAATATCNNNNNNNNNNNNNNNNTAGCNNNNNNNNNNNNNN
   NNNNNNNNNNNNNNA

25 +FBFFFDAFF8BCD42A9A>;1@CC40//-
   5:9888..99<<!!!!!!!!!!1.9375618&1!!!!!!!!!!!!!!!!!%4(3!!!!!!!!!!!!!!!!!!!!!!!!!!!4
   @ERR013136.28 IL24_4662:1:1:1080:2535/1

26 CTCTCCCCTTATCTCCTCTGGCCACTGTTTCAGATGCGGTGNNNNNNN
   NTCCACGTGCCCNNNNNNNNNNNNNNNNGCTCNNNNNNNNNNNNNNN
   NNNNNNNNNNNG

27 +G;GC?GEEGAGGGGGGGCB==A@CB@GBGBAECGB>;>@62!!!!!!!!!!-
   332542752:!!!!!!!!!!!!!!!!!61-1!!!!!!!!!!!!!!!!!!!!!!!!!!!/
   @ERR013136.29 IL24_4662:1:1:1081:3191/1

28 TGAGAATGGGTCACTTTGTTTCTCACATGTCGGGAAAGACANNNNNNN
   NNCTTTTTAGTTTNNNNNNNNNNNNNNNNGCAANNNNNNNNNNNNNNN
   NNNNNNNNNNNNNC

29 +DE9:EB@AEB>>D<BDEEEEED=C>?D@E;EBEEA9A?A?4!!!!!!!!!!-
   3422;;A8:6!!!!!!!!!!!!!!!!7123!!!!!!!!!!!!!!!!!!!!!!!!!!!!,

It is noted that although this table illustrates that the DNA fragment strings as including ambiguity information (letter N) this is not necessarily so and the ambiguity information can be regarded as additional information or be ignored of. If only four letters ACGT are included in the DNA fragment strings these letters can be encoded by two binary bits—else they can be encoded using 3 binary bits.

Referring back to FIG. 1A, stage 30 may be followed by stage 40 of extracting the DNA data from the mixture. Stage 40 may tolerate errors in the extraction of DNA data (by identifying additional information as DNA data and vise verse) as such errors can merely slightly reduce the compression ratio.

Stage 40 may include extracting the DNA data from the DNA data by searching for DNA fragment strings. DNA fragment strings may include multiple strings made of "A", "C", "G" and "T" letters. These DNA fragment strings may appear, for example, in the even rows of the table above.

The mixture can include multiple information strings. Stage 40 may include concatenating DNA fragment strings from the multiple information strings to provide the DNA data (that is compressed during stage 50).

It is noted that the number of DNA fragments strings that are concatenated and then compressed together can be very large—it may exceed 100 and even 1000 DNA fragments strings. The amount (or size) of DNA fragments strings to be concatenated before being compressed may be provided as a trade-off between compression efficiency (more information strings) to retrieval efficiency (less information strings).

If there is more than a single predefined codeword dictionary then stage 40 may be followed by stage 50 of selecting a selected predefined codeword dictionary to be used for compressing the DNA data. The selection can be made (explicitly or implicitly) by the user—for example by identifying the relevant member (the member that its DNA data is being compressed), by identifying a genre, race or any other demographic attribute of the relevant member, by specifying the species, family, genus or order of the relevant member.

The selecting (stage 50), out of multiple predefined codeword dictionaries, of the predefined codeword dictionary used for compressing the DNA data may be based upon an expected resemblance between the DNA data and the reference DNA data. The expected resemblance may be responsive to the species, family, genus or order of the relevant member and the species, family, genus or order associated with one or more of the reference DNA.

The selection may include finding a best-matching predefined codeword dictionary—the predefined code word dictionary that is expected to provide a best match to the DNA data. Optimal or sub-optimal selection schemes may be applied.

Stages 40 and/or 50 may be followed by stage 60 of compressing the DNA data to provide compressed DNA data. The compressing of stage 60 includes encoding the DNA data by using the predefined code word dictionary (that was constructed based upon reference DNA data).

Figure 1B:
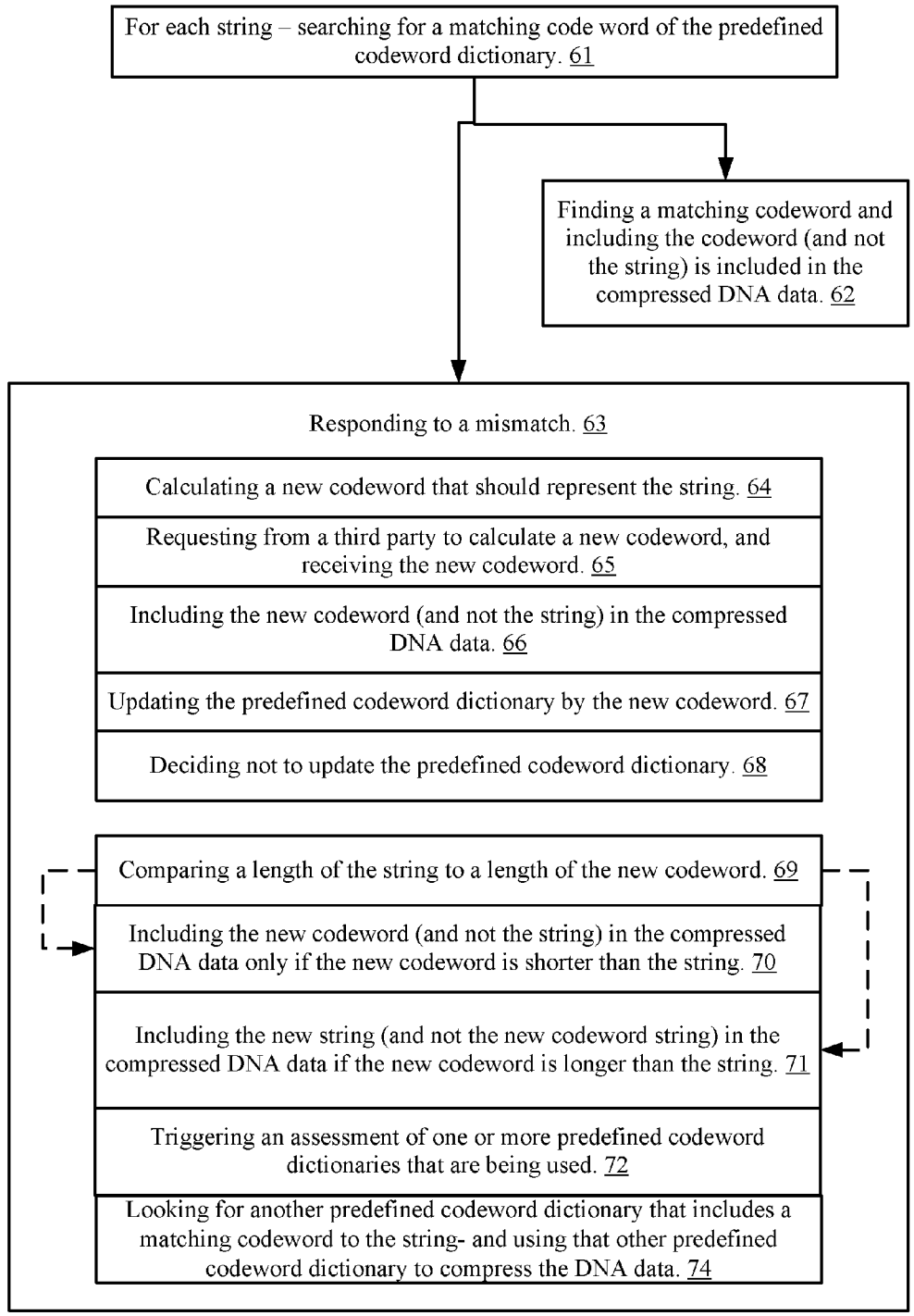
FIG. 1B illustrates a stage of the method of FIG. 1A according to an embodiment of the invention.

Stage 60 may include the following stages (all illustrated in FIG. 1B):
a. For each string (variable length or fixed length strings) of the DNA data—searching (61) for a matching code word of the predefined codeword dictionary.
b. If the predefined codeword dictionary includes such a matching codeword then that codeword (and not the string) is included (62) in the compressed DNA data.
c. If, for the string, the predefined codeword dictionary does not include any matching codeword then the method includes responding (63) to a mismatch. The responding (63) may include:
  i. Calculating (64) a new codeword that should represent the string.
  ii. Requesting (65) from a third party (for example—entity that generated the predefined codeword dictionary) to calculate a new codeword, and receiving the new codeword.
  iii. Including (66) the new codeword (and not the string) in the compressed DNA data.
  iv. Updating (67) the predefined codeword dictionary by the new codeword.
  v. Deciding (68) not to update the predefined codeword dictionary.
  vi. Comparing (69) a length of the string to a length of the new codeword.
  vii. Including (70) the new codeword (and not the string) in the compressed DNA data only if the new codeword is shorter than the string.
  viii. Including (71) the new string (and not the new codeword string) in the compressed DNA data if the new codeword is longer than the string.
  ix. Triggering (73) an assessment of one or more predefined codeword dictionaries that are being used.
  x. Looking (74) for another predefined codeword dictionary that includes a matching codeword to the string-and using that other predefined codeword dictionary to compress the DNA data.

Referring back to FIG. 1A-*stage* 40 may also be followed by stage 80 of generating location information indicative of a location of DNA data elements and additional information elements within the mixture. This location information will enable a reconstruction of the mixture when the mixture (or portion thereof) is retrieved.

Stage 80 may also include processing the location information by applying at least one out of error correction encoding, error detection encoding and compression to provide processed location information. In the following text the phrase location information may refer to processed location information or to unprocessed location information.

Stage 80 may also include processing the additional information by applying at least one out of error correction encoding, error detection encoding and compression. In the following text the phrase additional information may refer to processed additional information or to unprocessed additional information.

Stages 60 and 80 may be followed by stage 90 of storing the compressed DNA data, the location information and the additional information at a storage system.

Stage 90 may include at least one of the following: (a) storing at least one of the additional information and the location information at a first logical address space and storing the compressed DNA data at a second logical address space; (b) storing the additional information, the location information and the compressed DNA data at different logical address spaces; (c) storing the additional information, the location information and the compressed DNA data at proximate logical address spaces.

Figure 3:
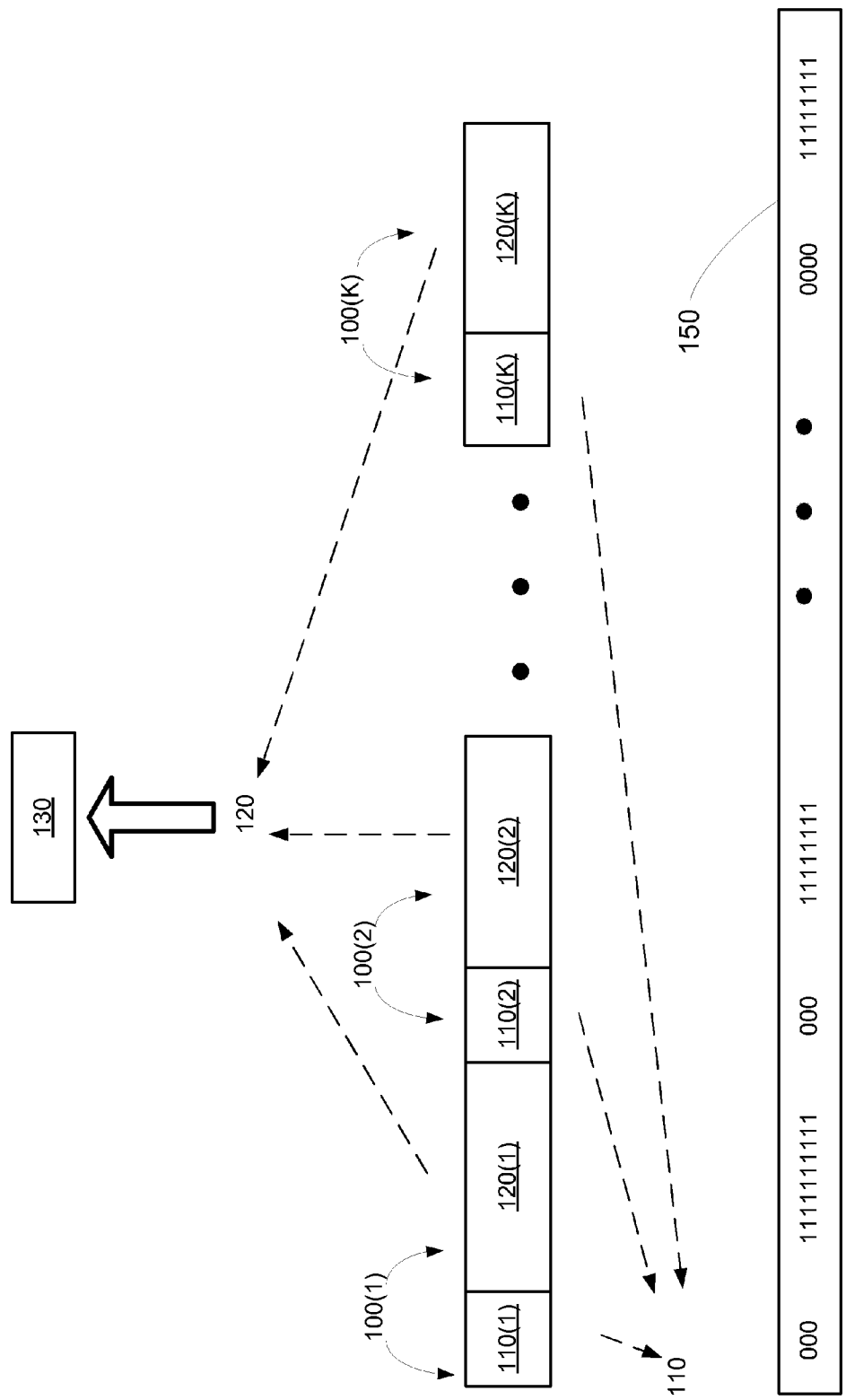
FIG. 3 illustrates a mixture of DNA data and additional information and also illustrates compressed DNA data, processed additional information and location information, according to an embodiment of the invention.

FIG. 3 illustrates a mixture 100 of DNA data 110 and additional information 120 and also illustrates compressed DNA data 130, additional information 120 and location information 150 according to an embodiment of the invention.

FIG. 3 illustrates the location information 150 as being a vector and its elements may indicate the order of DNA data 110 and additional information 120 in the mixture 100. Each element may represent a fixed amount of bits of the mixture.

For example, "1" valued bits may represents DNA data symbols and "0" valued bits may represent additional information symbols.

The mixture 100 and location information 150 can be processed to provide compressed DNA data 130, additional information 140 and location information 150 that are stored in a storage system. The additional information 140 and the location information 150 may be processed or not.

Referring back to FIG. 1A, method 10 may also include stage 99 of evaluating the predefined codeword dictionary used for compressing the DNA data.

If there are multiple predefined codeword dictionaries then stage 99 may include evaluating one or more of these multiple predefined codeword dictionaries and even replacing a predefined codeword dictionary used to compress DNA data. The evaluating may include trying to compress the same reference DNA data elements and comparing compression ratios. Even if there is only a single predefined codeword dictionary it may be evaluated to determine whether to update it—for example by applying it on reference DNA data that includes new DNA data acquired after the last update of the predefined codeword dictionary.

Stages 20-90 assist in reducing the overall size of information to be stored at the storage system. After the information is stored in the storage system there may be a need to retrieve the mixture (or portions thereof)—and this may require reversing at least some of stages 20-90. An example of such a reversal is provided in FIG. 4.

Reconstructing DNA Data

Figure 4:
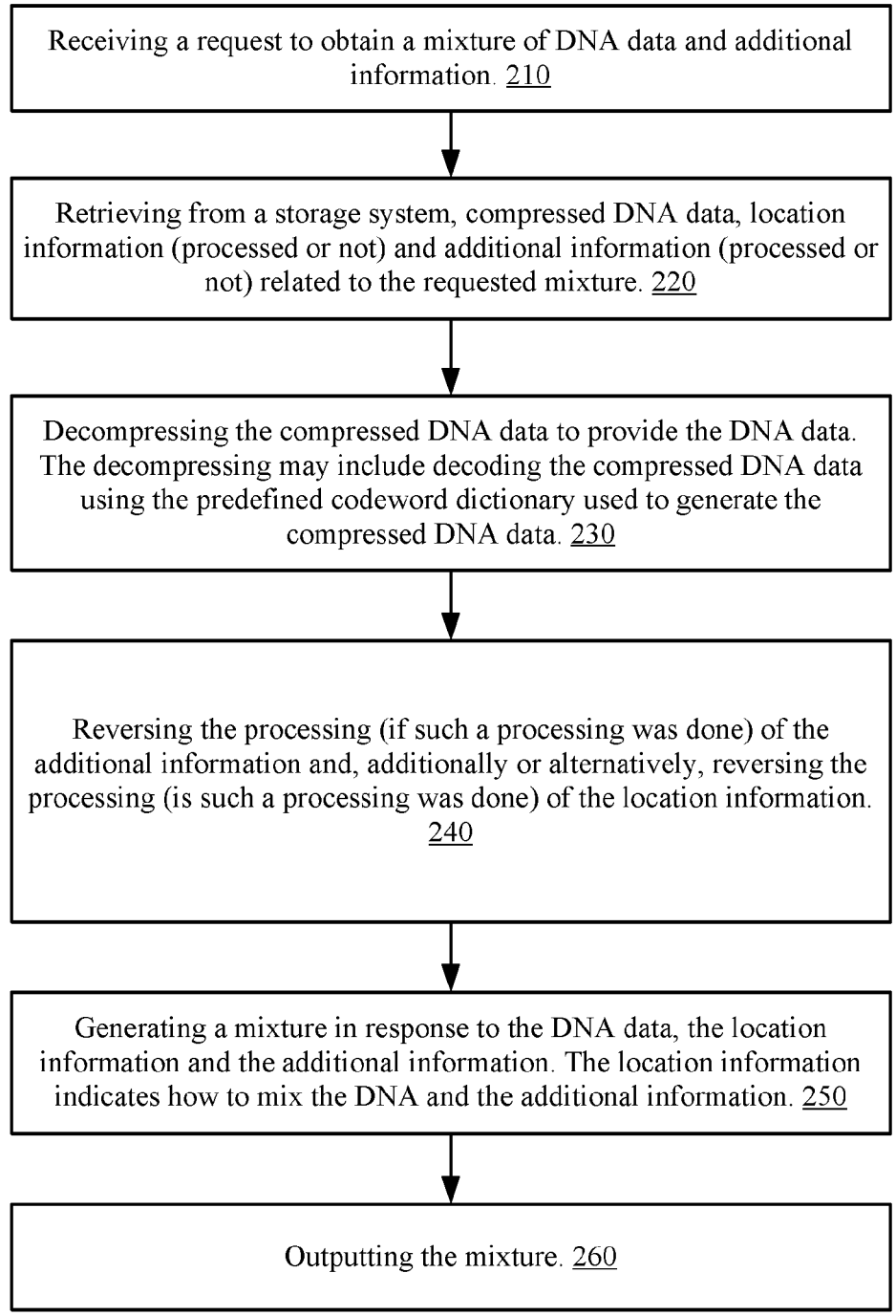
FIG. 4 illustrates a method according to an embodiment of the invention.

FIG. 4 illustrates method 200 according to an embodiment of the invention.

Method 200 starts by stage 210 of receiving a request to obtain a mixture of DNA data and additional information.

Stage 210 may be followed by stage 220 of retrieving from a storage system, compressed DNA data, location information (processed or not) and additional information (processed or not) related to the requested mixture. The retrieval can be done in predetermined chunks—having size that is determined by a management module of the storage system.

Stage 220 may be followed by stages 230 and 240.

Stage 230 may include decompressing the compressed DNA data to provide the DNA data. The decompressing may include decoding the compressed DNA data using the predefined codeword dictionary used to generate the compressed DNA data.

Stage 240 may include reversing the processing (if such a processing was done) of additional information and, additionally or alternatively, reversing the processing (if such a processing was done) of the location information.

Stages 230 and 240 are followed by stage 250 of generating a mixture in response to the DNA data, the location information and the additional information. The location information indicates how to mix the DNA and the additional information. Stage 250 may include reversing the concatenation of DNA fragment strings from multiple information strings and providing the mixture as including multiple separate information strings.

Stage 250 may be followed by stage 260 of outputting the mixture.

Figure 5:
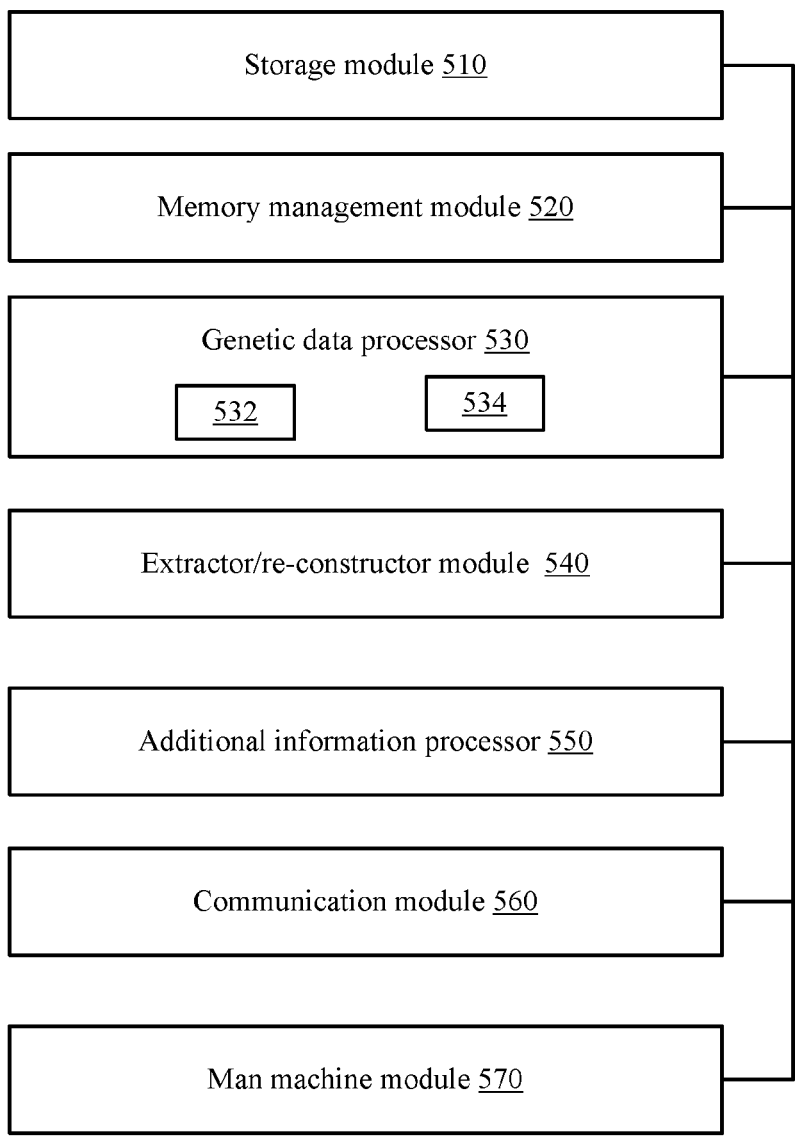
FIG. 5 illustrates a storage system according to an embodiment of the invention.

FIG. 5 illustrates a storage system 500 according to an embodiment of the invention.

The storage system 500 includes a storage module 510, a management module 520, a genetic data processor 530, extractor/re-constructor module 540, additional information processor 550, a communication module 560 and a man machine interface 570.

The management module 520 may manage the storage of information in the storage module 510. It may be capable of performing mirroring, creating snapshots, executing redundancy schemes and any other data management processes.

The communication module 560 may exchange information and commands with other systems it may include the man machine interface 570. It may include one or more interfaces for exchanging information, commands and the like.

The man machine interface 570 may present information to a user of the storage system, receive information and commands from the user.

The genetic data processor 530 is illustrated as including a DNA data compressor 532, and a DNA data de-compressor 534.

The DNA data compressor 532 may be arranged to compress the DNA data to provide compressed DNA data. The compression may include encoding the DNA data by using a predefined codeword dictionary that was constructed based upon reference DNA data.

The DNA data de-compressor 534 may be arranged to decompress the compressed DNA data to provide DNA data. The de-compression may include decoding the compressed DNA data by using a predefined codeword dictionary that was used to generate the compressed DNA data.

The extractor/re-constructor module 540 may be arranged to extract the DNA data and the additional information from the mixture. It is also arranged to reconstruct a mixture when given location information, DNA data and additional information.

A compression ratio of about 1:20 was obtained by applying the mentioned below method. Thus, the mixture 100 is 20 times bigger than the combination of compressed DNA data 130, additional information 120 and location information 150.

Distribution of Genetic Information of a Vast Genetic Information Database

Figure 6:
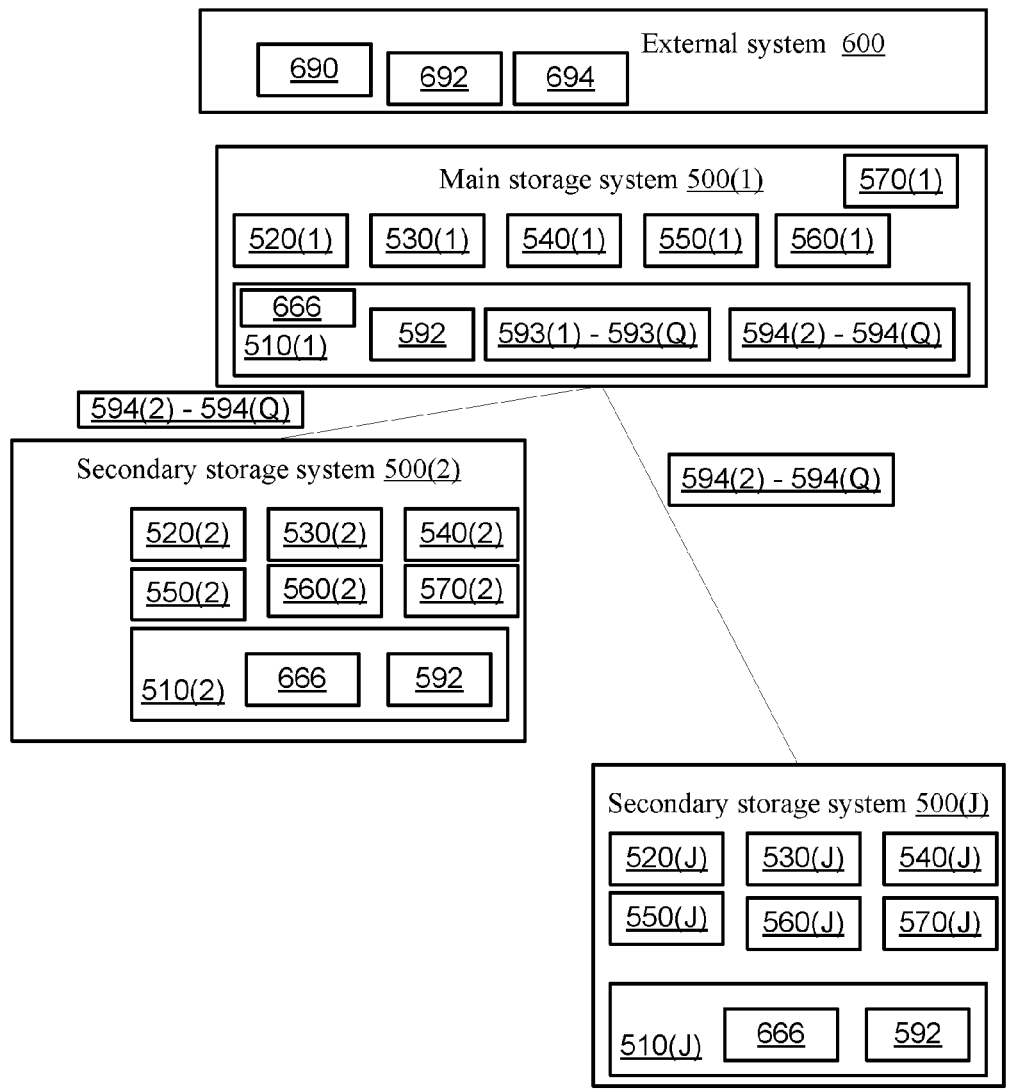
FIG. 6 illustrates a plurality of storage systems and an external system according to an embodiment of the invention.

FIG. 6 illustrates a plurality of storage systems 500(1)-500(J) and external system 600 according to an embodiment of the invention.

Storage systems 500(1)-500(J) form a system that may include a main storage system 500(1) and secondary storage systems 500(2)-500(J).

Storage system 500(1) is referred to as a main storage system as it may obtain a copy of a vast genetic information database such as but not limited to the 1000 Genomes project database. This may include copying physical media that were loaded with portions of the vast genetic database from the external system 600 itself. The external system 600 and the storage system 500(1) can include ports (not shown) used for direct coupling and facilitate a very high speed transfer of information—a speed that can be few hundred times faster that Internet communication.

The genetic information database is vast in the sense that it is too big for conventional downloading via communication links. The uploading of the entire vast genetic information database via normal communication links is either very costly or may last even more than a year. For example, the current size of the genetic information database of the 1000 Genomes project exceeds 200 Terabytes. It will take few years to download this genetic information database over a 1 Megabit per second communication link.

The main storage system 500(1) may obtain at an initial point in time a copy of the vast genetic information database from external system 600. It can be done by using physical media (disks, tapes) that convey a copy of the vast genetic information database. The main storage system 500(1) can be positioned in proximity to the external system 600 to enable the provision of the vast genetic database via means that are much faster that Internet based network communication.

According to an embodiment of the invention the main storage system can receive the vast genetic information database by being directly coupled (not via the Internet or relatively slow communication networks) but via cables to the external system to allow a retrieval of the vast genetic information database using the direct coupling. The retrieval can be made at rate that exceeds a rate of transfer of information via the Internet.

Alternatively, the provision of the vast genetic database to the main storage system may involve copying the vast genetic information database from an external system to physical media, and retrieving the vast genetic information database from the hardware media. For example, if the external system is located at Boston, the main storage system can be sent to Boston. High speed IO ports of the main storage system can facilitate a retrieval of data at a rate of (for example) 1.5 PetaBytes per day.

It is noted that the secondary storage systems can be loaded with the vast genetic information database or with a compressed version of the vast genetic information database (the compressed genetic information database)—either by using physical media or by direct coupling with another storage system (including the main storage system or another secondary storage system).

The external system 600 may be a storage system and may store the vast genetic information database of the 1000 Genomes project.

Instead of transmitting the vast genetic information database—the main storage system 500(1) may compress the vast genetic information database—by applying method 10 or by executing at least some of the stages of method 10.

For example—main storage system 500(1) can execute stages 20, 50 and 90 of method 10 and may skip stages such as stages 40 and 80—if it can access DNA data of the vast genetic information database without needing to extract such DNA data from a mixture.

According to an embodiment of the invention the main storage system 500(1) can receive or generate one or more predefined codeword dictionaries to be used to compress the vast genetic information database. A predefined codeword dictionary can be constructed using the vast genetic information database—the entire database or portions of the database. It is expected that a predefined codeword dictionary can be very effective if constructed based upon the entire (or at least the majority of) the vast genetic information database.

The main storage system 500(1) may be arranged to transmit to these secondary storage systems 500(2)-500(J) one or more predefined codeword dictionaries it constructed based upon the vast genetic information database. J being an integer that exceeds one.

The vast genetic information database can be updated over time. External system 600 can distribute updates that are formatted according to a format that is unique to the external system 600.

The main storage system 500(1) may transmit these updates and the secondary storage systems 500(2)-500(J) may be receive these updates and update their own copies (reconstructed from the compressed genetic information database).

Alternatively, the main storage system 500(1) and secondary storage systems 500(2)-500(J) may utilize storage system techniques for keeping the secondary storage systems 500(2)-500(J) updated.

The main storage system 500(1) can receive updates to the vast genetic information database from the external system 600 and update the vast genetic information database it stores. The update may include decompressing portions of the compressed genetic database that should be updated, updating these portions and compressing them again in order to keep the compressed genetic information database updated.

The main storage system 500(1) may be arranged to generate different points in time snapshots of the compressed genetic information database.

Instead of generating these different points in time snapshots—the main storage system 500(1) can calculate differences between different snapshots (especially difference from one snapshot to a consecutive snapshot) and transmit these differences to the secondary storage systems 500(2)-500(J). The secondary storage systems 500(2)-500(J) may reconstruct the different point in time snapshots and update their compressed genetic information database accordingly.

The main storage system 500(1) may include:
a. Genetic data processor 530(1) that is arranged to compress a vast genetic information database to provide a compressed genetic information database. The genetic data processor 530(1) may be arranged to update the compressed genetic information database.
b. Storage module 510(1) that is arranged to store the compressed genetic information database.
c. Memory management module 520(1) arranged to generate different point in time snapshots of the compressed genetic information database and to calculate differences between the different point in time snapshots of the compressed genetic information database.
d. Communication module 560(1) that is arranged to receive updates to the vast genetic information database and is arranged to transmit the differences to at least one secondary storage system that is accessible to a user.

The genetic data processor 530(1) may be arranged to compress of the vast genetic information database by encoding genetic information by using a predefined codeword dictionary. It may apply method 10 or any of its stages. It may calculate the predefined codeword dictionary based upon the vast genetic information database or a substantial portion of the vast genetic information database.

It is noted that the main storage system 500(1) and any of the secondary storage systems 500(2)-500(J) may also include extractor/de-constructor modules (such as 540 of FIG. 5) and additional information processors (such as 550 of FIG. 5)—is such modules are required.

Any secondary storage system such as secondary storage system 500(2) may include:
a. A communication module 560(2) that is arranged to receive via direct coupling of from a physical media a compressed genetic information database or the vase genetic information database. The communication module 560(2) may be arranged to receive differences between different point in time snapshots of the compressed genetic information database. The communication module 560(2) may also be arranged to receive a request from a user to provide a portion of the vast genetic information database and to provide to the user the portion of the vast genetic information database.
b. A genetic data processor 530(2) that is arranged decompress the compressed genetic information database (if the secondary storage system received the compressed database) to provide a vast genetic information database and to decompress differences between point tin time snapshots of the compressed genetic database to reconstruct updates to the vast genetic information database;

c. A memory management module 520(2) that is arranged to update the vast genetic information database with the updates.
d. Storage module 520(2).
e. Man machine interface 550(2).

The genetic data processor 530(2) may be arranged to decompress of the compressed genetic information database by decoding genetic information by using a predefined codeword dictionary.

The genetic data processor 530(2) may be arranged to calculate the predefined codeword dictionary based upon the vast genetic information database.

The communication module 540(2) may be arranged to receive the predefined codeword dictionary from the main storage system.

FIG. 6 illustrates the external storage system 600 as storing the vast genetic information database 690 and various updates such as updates 692 and 694.

FIG. 6 also illustrates the main storage system 500(1) as storing the compressed genetic database 592 as well as different point in time snapshots 593(1)-593(Q) of the compressed genetic database 592, and differences 594(2)-594(Q) that represent differences between consecutive points in time snapshots (each snapshot is represented in FIG. 6 by data deltas associated with it—593(1)-593(Q)) of the compressed genetic database 592.

Difference 594($q$) represents the difference between point in time snapshots 593($q$-1) and 593($q$), wherein q ranges between 2 and Q. These differences include data deltas that are associated are included in one point in time snapshot and not in another point in time snapshots. These differences are transmitted to the secondary storage systems and are used to reconstruct the compressed genetic database 592 at each of the secondary storage systems 500(2)-500(J).

FIG. 6 also illustrates a predefined codeword dictionary 666 that is created by the main storage system 500(1) in response to the content of the vast genetic information database and is transmitted to the secondary storage systems 500(2)-500(J).

It is noted that the storage systems 500(1)-500(J) may be connected to each other using a star topology, a mesh topology, or any other manner. There may be more that a single main storage system.

Figure 9:
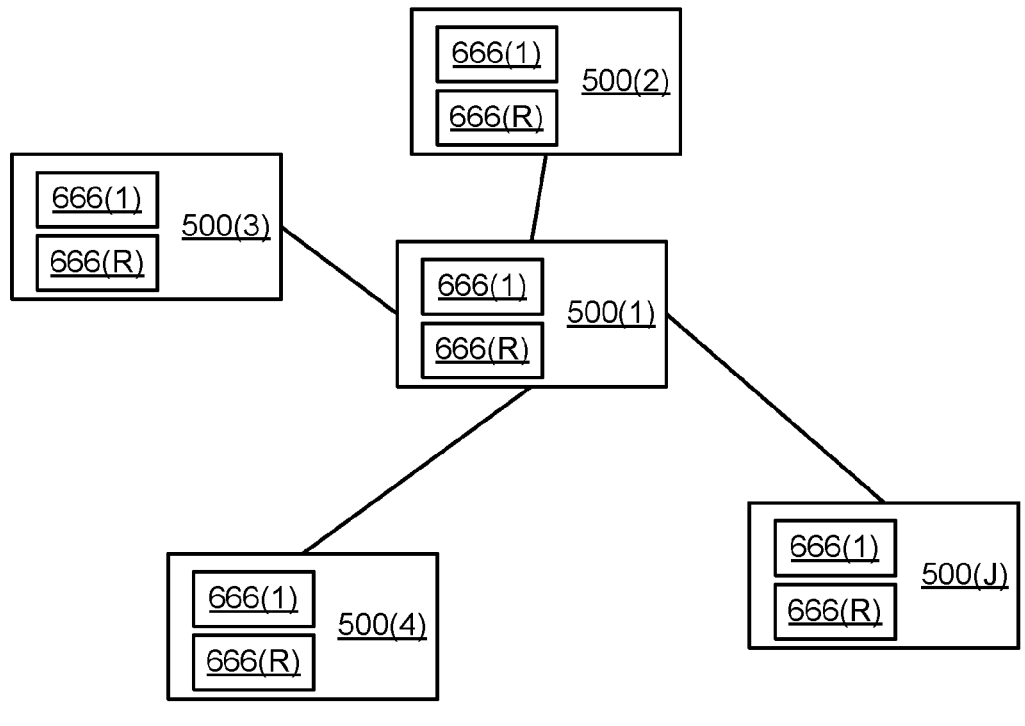
FIG. 9 illustrates a plurality of storage systems and an external system according to an embodiment of the invention.

FIG. 9 illustrates a system 900 according to an embodiment of the invention. System 900 may include a main storage system 500(1) that is coupled to each one of multiple secondary storage systems 500(2), 500(3), 400(4) and 500(J)—to provide system 900 of a star configuration. FIG. 9 also illustrates each of the storage systems 500(1)-500(J) as storing multiple predefined codeword dictionaries 666(1)-666(R).

Figure 10:
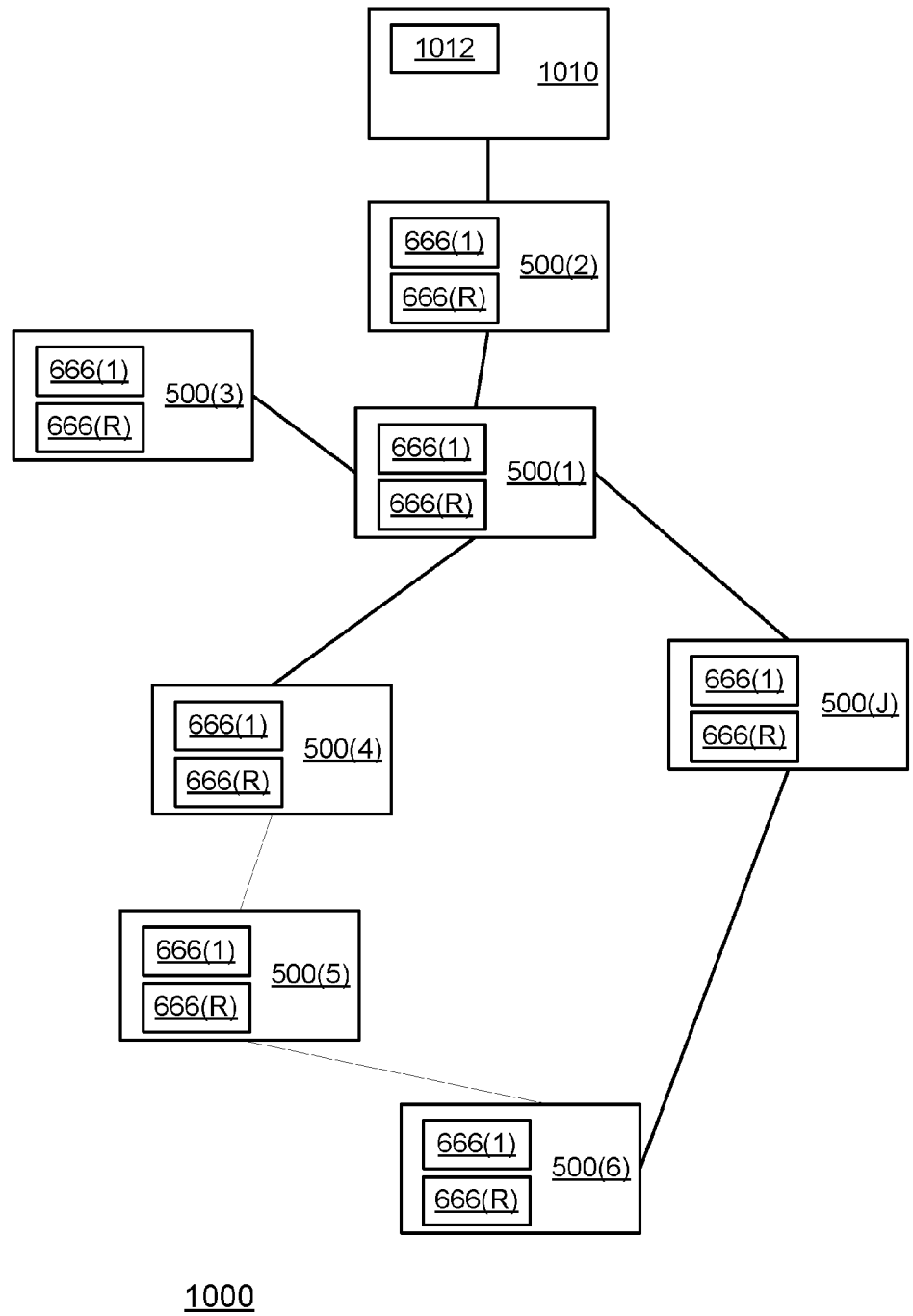
FIG. 10 illustrates a computer of a user, a plurality of storage systems and an external system according to an embodiment of the invention.

FIG. 10 illustrates a system 1000, external system 600 and user computer 1010 according to an embodiment of the invention.

System 1000 includes storage systems 500(1)-500(6) and 500(J). It has a more complex configuration than the star configuration of system 900 of FIG. 9. Main storage system 500(1) is coupled to secondary storage systems 500(2)-500(4). Secondary storage system 500(5) is coupled between secondary storage systems 500(4) and 500(6). Secondary storage system 500(J) is coupled between secondary storage system 500(6) and main storage system 500(1).

Each one of the storage systems 500(1)-500(6) and 500(J) as storing multiple predefined codeword dictionaries 666(1)-666(R).

Secondary storage system 500(2) is illustrated as being coupled to user computer 1010 that hosts application 1012 that is arranged to display to the user genetic information. The application can be a legacy application that is capable of interfacing with external system 600, can be adapted to interface with the secondary storage system 500(2) and with the external system 600 or can be arranged to interface only with the secondary storage system 500(2).

Figure 7:
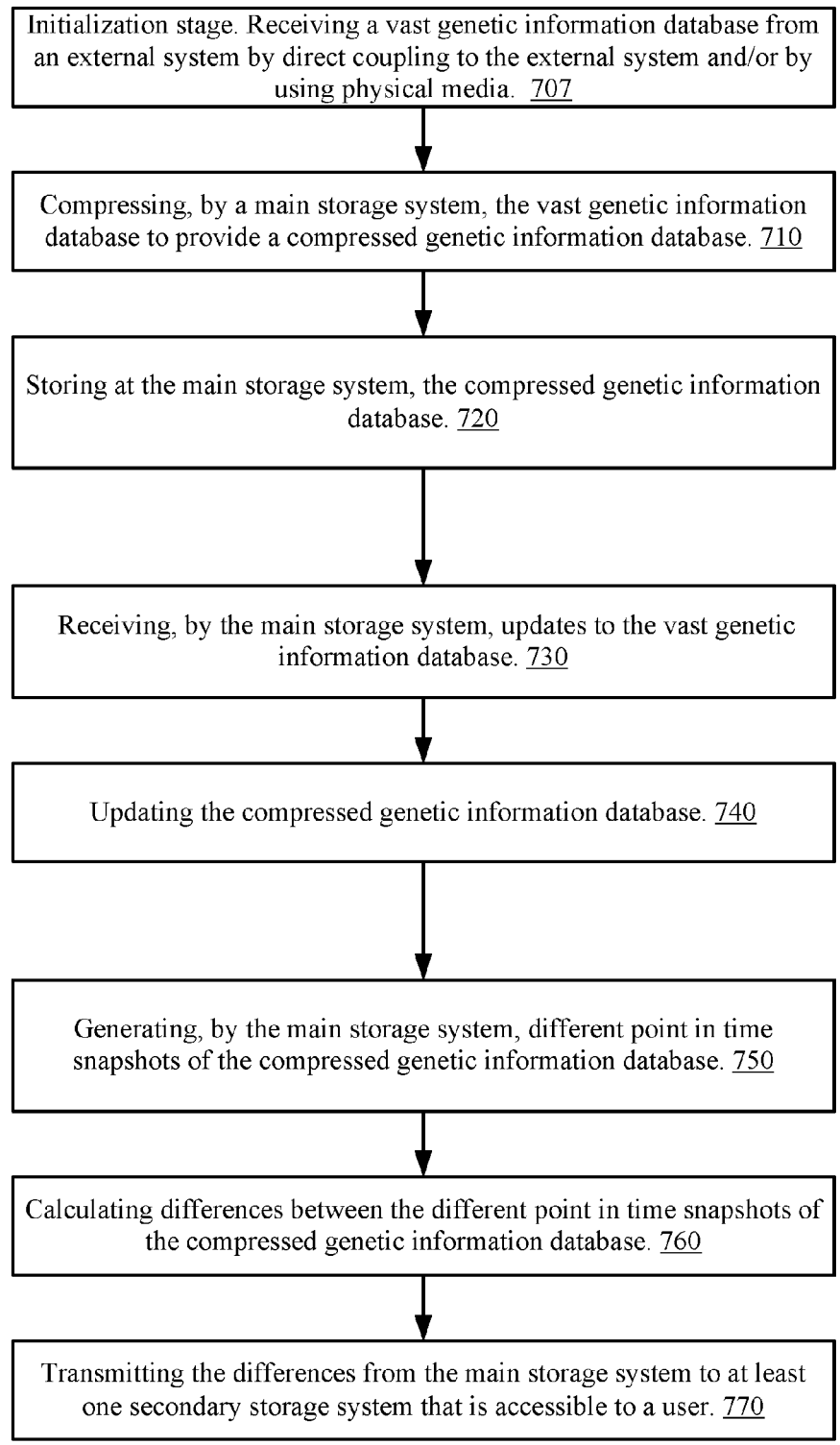
FIG. 7 illustrates a method according to an embodiment of the invention.

FIG. 7 illustrates a method 700 according to an embodiment of the invention.

Method 700 may start by an initialization stage 707.

The initialization stage 707 may include receiving a copy of the vast genetic database, receiving one or more predefined codeword dictionaries or calculating one or more predefined codeword dictionaries. The copy may be received using physical media and/or direct coupling to the external system that stores the vast genetic information database.

The calculating of one or more predefined codeword dictionaries may be based upon the vast genetic information database or a substantial portion of the vast genetic information database. Known codeword dictionary building methods can be applied. A typical building method may assign codewords of lengths that are inversely proportional to a popularity of strings.

Stage 707 may be followed by stage 710 of compressing, by a main storage system, a vast genetic information database to provide a compressed genetic information database.

Stage 710 may be followed by stage 720 of storing at the main storage system, the compressed genetic information database.

Stage 710 may include applying stage 60 of method 10 of FIG. 1, applying any stage of method 10, and encoding genetic information by using a predefined codeword dictionary.

Stage 720 may be followed by stage 730 of receiving, by the main storage system, updates to the vast genetic information database.

Stage 730 may be followed by stage 740 of updating the compressed genetic information database.

Stage 740 may be followed by stage 750 of generating, by the main storage system, different point in time snapshots of the compressed genetic information database.

Stage 750 may be followed by stage 760 of calculating differences between the different point in time snapshots of the compressed genetic information database.

Stage 760 may be followed by stage 770 of transmitting the differences from the main storage system to at least one secondary storage system that is accessible to a user.

FIG. 8 illustrates a method 800 according to an embodiment of the invention.

Stage 800 may be executed by a secondary storage system.

Method 800 may start by stage 807 of receiving one or more predefined codeword dictionaries or calculating one or more predefined codeword dictionaries. The main storage system or other secondary storage system may provide the one or more predefined codeword dictionaries.

Stage 807 may be followed by stage 810 of receiving, by a secondary storage system a compressed genetic information database. This can be executed by using physical media and/or direct coupling to a storage system (or an external system) that stores the compressed genetic information database.

Stage 810 may be followed by stage 820 of decompressing the compressed genetic information database to provide a vast genetic information database.

According to an embodiment of the invention stage 810 may include receiving the vast genetic information database by using physical media and/or direct coupling and skipping stage 820.

Stage 820 may be followed by stage 830 of receiving, by the secondary storage system, differences between different point in time snapshots of the compressed genetic information database.

Stage 830 may be followed by stage 840 of decompressing the differences to reconstruct updates to the vast genetic information database.

Stage 840 may be followed by stage 850 of updating the vast genetic information database with the updates.

Stage 840 may include decoding genetic information by using a predefined codeword dictionary.

Stage 850 may be followed by stage 860 of receiving a request from a user to provide a portion of the vast genetic information database.

Stage 860 may be followed by stage 870 of providing to the user the portion of the vast genetic information database.

It is noted that the vast genetic information database can be accessed by an application (or other software) that can be installed on a computer of a user (such as application 102 of FIG. 10). The vast genetic database of the 1000 Genus project may be stored in a slightly compressed form. The application can receive genetic information from the vast genetic database in the slightly compressed form or in a raw form. Each secondary storage system can provide the application with requested genetic information in a raw or slightly compressed form. The application may be hosted by the interface of any of the secondary storage systems or on any computer that may access the secondary storage system. In order to handle slightly compressed format or any format in which the vast genetic information database is stored—the main storage device may be arranged to handle such format and it may either change the format before compressing the vast genetic information database or compress the vast genetic information data base—even when it is formatted according to said format.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

SEQUENCE LISTING

```
<160> NUMBER OF SEQ ID NOS: 14

<210> SEQ ID NO 1
<211> LENGTH: 108
<212> TYPE: DNA
<213> ORGANISM: Artificial Sequence
<220> FEATURE:
<223> OTHER INFORMATION: computer generated random sequence
<220> FEATURE:
<221> NAME/KEY: misc_feature
```

```
<222> LOCATION: (1)..(108)
<223> OTHER INFORMATION: n=a, t, g, or c

<400> SEQUENCE: 1
ctatgctttg tcctgctcct cctacccaga cgttgcaaca nnnnnnnnnn ncnnnnnnnn    60
nnnnnnntgg cnnnnnnnnn nnnnnnnnnn nnnnnnnnnn nnnnnnnc                108

<210> SEQ ID NO 2
<211> LENGTH: 108
<212> TYPE: DNA
<213> ORGANISM: Artificial Sequence
<220> FEATURE:
<223> OTHER INFORMATION: computer generated random sequence
<220> FEATURE:
<221> NAME/KEY: misc_feature
<222> LOCATION: (1)..(108)
<223> OTHER INFORMATION: n=a, t, g, or c

<400> SEQUENCE: 2
aaactataat cctccaagtt agattcacac ctaatctagt nnnnnnnnnn nttctcagag    60
gnnnnnnnnn nnnnnnagtt nnnnnnnnnn nnnnnnnnnn nnnnnnnc                108

<210> SEQ ID NO 3
<211> LENGTH: 108
<212> TYPE: DNA
<213> ORGANISM: Artificial Sequence
<220> FEATURE:
<223> OTHER INFORMATION: computer generated random sequence
<220> FEATURE:
<221> NAME/KEY: misc_feature
<222> LOCATION: (1)..(108)
<223> OTHER INFORMATION: n=a, t, g, or c

<400> SEQUENCE: 3
tttgagactg acttctgaca taatctatag tccaaaatct nnnnnnnnnn natgaagacc    60
tnnnnnnnnn nnnnnntttc nnnnnnnnnn nnnnnnnnnn nnnnnnng                108

<210> SEQ ID NO 4
<211> LENGTH: 108
<212> TYPE: DNA
<213> ORGANISM: Artificial Sequence
<220> FEATURE:
<223> OTHER INFORMATION: computer generated random sequence
<220> FEATURE:
<221> NAME/KEY: misc_feature
<222> LOCATION: (1)..(108)
<223> OTHER INFORMATION: n=a, t, g, or c

<400> SEQUENCE: 4
aatttacaag aaaaaattaa accacccatc gaaaactggg nnnnnnnnnn gaacactttt    60
cnnnnnnnnn nnnnnntgca nnnnnnnnnn nnnnnnnnnn nnnnnnna                108

<210> SEQ ID NO 5
<211> LENGTH: 108
<212> TYPE: DNA
<213> ORGANISM: Artificial Sequence
<220> FEATURE:
<223> OTHER INFORMATION: computer generated random sequence
<220> FEATURE:
<221> NAME/KEY: misc_feature
<222> LOCATION: (1)..(108)
<223> OTHER INFORMATION: n=a, t, g, or c

<400> SEQUENCE: 5
ggaatatttg ttggggatga aaaagagatc taaatgtgtc nnnnnnnnnn nagcctgact    60
```
gnnnnnnnnn nnnnnntatg nnnnnnnnnn nnnnnnnnnn nnnnnnnt         108

<210> SEQ ID NO 6
<211> LENGTH: 108
<212> TYPE: DNA
<213> ORGANISM: Artificial Sequence
<220> FEATURE:
<223> OTHER INFORMATION: computer generated random sequence
<220> FEATURE:
<221> NAME/KEY: misc_feature
<222> LOCATION: (1)..(108)
<223> OTHER INFORMATION: n=a, t, g, or c

<400> SEQUENCE: 6
tgaatcacaa cagaaaatgg aagagaaaac ataacttcct nnnnnnnnnn tcatgggcac      60
annnnnnnnn nnnnnngaag nnnnnnnnnn nnnnnnnnnn nnnnnnnt         108

<210> SEQ ID NO 7
<211> LENGTH: 108
<212> TYPE: DNA
<213> ORGANISM: Artificial Sequence
<220> FEATURE:
<223> OTHER INFORMATION: computer generated random sequence
<220> FEATURE:
<221> NAME/KEY: misc_feature
<222> LOCATION: (1)..(108)
<223> OTHER INFORMATION: n=a, t, g, or c

<400> SEQUENCE: 7
tactcattaa tattgaatta ctataattaa tattatgata nnnnnnnnnn gatagaatga      60
tnnnnnnnnn nnnnnnattc nnnnnnnnnn nnnnnnnnnn nnnnnnnc         108

<210> SEQ ID NO 8
<211> LENGTH: 108
<212> TYPE: DNA
<213> ORGANISM: Artificial Sequence
<220> FEATURE:
<223> OTHER INFORMATION: computer generated random sequence
<220> FEATURE:
<221> NAME/KEY: misc_feature
<222> LOCATION: (1)..(108)
<223> OTHER INFORMATION: n=a, t, g, or c

<400> SEQUENCE: 8
cggctgtggt ggcgggtgcc tgtagtccca gctactcggg nnnnnnnnnn aggagaatgg      60
cnnnnnnnnn nnnnnncgag nnnnnnnnnn nnnnnnnnnn nnnnnnng         108

<210> SEQ ID NO 9
<211> LENGTH: 108
<212> TYPE: DNA
<213> ORGANISM: Artificial Sequence
<220> FEATURE:
<223> OTHER INFORMATION: computer generated random sequence
<220> FEATURE:
<221> NAME/KEY: misc_feature
<222> LOCATION: (1)..(108)
<223> OTHER INFORMATION: n=a, t, g, or c

<400> SEQUENCE: 9
aaagaccatg ctttaggatt gcaccacatt gtttcaacac nnnnnnnnnn gaagaacatt      60
tnnnnnnnnn nnnnnnaaat nnnnnnnnnn nnnnnnnnnn nnnnnnnt         108

<210> SEQ ID NO 10
<211> LENGTH: 108
<212> TYPE: DNA
<213> ORGANISM: Artificial Sequence

```
<220> FEATURE:
<223> OTHER INFORMATION: computer generated random sequence
<220> FEATURE:
<221> NAME/KEY: misc_feature
<222> LOCATION: (1)..(108)
<223> OTHER INFORMATION: n=a, t, g, or c

<400> SEQUENCE: 10
aaccaaccaa caataaccac caaaagtata ttaaacaagt annnnnnnnn taagaataca      60
tnnnnnnnnn nnnnnntgtg nnnnnnnnnn nnnnnnnnnn nnnnnnna                 108

<210> SEQ ID NO 11
<211> LENGTH: 108
<212> TYPE: DNA
<213> ORGANISM: Artificial Sequence
<220> FEATURE:
<223> OTHER INFORMATION: computer generated random sequence
<220> FEATURE:
<221> NAME/KEY: misc_feature
<222> LOCATION: (1)..(108)
<223> OTHER INFORMATION: n=a, t, g, or c

<400> SEQUENCE: 11
ataaaaatta acaagtgaag agaaaacatg tggaatagga gnnnnnnnnn gtaaactagc      60
nnnnnnnnnn nnnnnaatan nnnnnnnnnn nnnnnnnnnn nnnnnnnc                 108

<210> SEQ ID NO 12
<211> LENGTH: 108
<212> TYPE: DNA
<213> ORGANISM: Artificial Sequence
<220> FEATURE:
<223> OTHER INFORMATION: computer generated random sequence
<220> FEATURE:
<221> NAME/KEY: misc_feature
<222> LOCATION: (1)..(108)
<223> OTHER INFORMATION: n=a, t, g, or c

<400> SEQUENCE: 12
ccaaaaaact aaaggaaaaa gccatgttta aaaaagtaca annnnnnnnn ataacaatat      60
cnnnnnnnnn nnnnnntagc nnnnnnnnnn nnnnnnnnnn nnnnnnna                 108

<210> SEQ ID NO 13
<211> LENGTH: 108
<212> TYPE: DNA
<213> ORGANISM: Artificial Sequence
<220> FEATURE:
<223> OTHER INFORMATION: computer generated random sequence
<220> FEATURE:
<221> NAME/KEY: misc_feature
<222> LOCATION: (1)..(108)
<223> OTHER INFORMATION: n=a, t, g, or c

<400> SEQUENCE: 13
ctctcccctt atctcctctg gccactgttt cagatgcggt gnnnnnnnnn tccacgtgcc      60
cnnnnnnnnn nnnnngctc nnnnnnnnnn nnnnnnnnnn nnnnnng                  108

<210> SEQ ID NO 14
<211> LENGTH: 108
<212> TYPE: DNA
<213> ORGANISM: Artificial Sequence
```

```
<220> FEATURE:
<223> OTHER INFORMATION: computer generated random sequence
<220> FEATURE:
<221> NAME/KEY: misc_feature
<222> LOCATION: (1)..(108)
<223> OTHER INFORMATION: n=a, t, g, or c

<400> SEQUENCE: 14
tgagaatggg tcactttgtt tctcacatgt cgggaaagac annnnnnnnn cttttagtt      60 tnnnnnnnnn nnnnnngcaa nnnnnnnnnn nnnnnnnnnn nnnnnnnc                108
```

We claim:

1. A method for compressing information by a computerized system, the method comprises: receiving a mixture of DNA deoxyribonucleic acid data and additional information; compressing the DNA data to provide compressed DNA data, wherein the compressing comprises encoding the DNA data by using a predefined codeword dictionary that was constructed based upon reference DNA data; and
   selecting, out of multiple predefined codeword dictionaries, the predefined codeword dictionary used for compressing the DNA data based upon an expected resemblance between the DNA data and the reference DNA data.

2. A method for compressing information by a computerized system, the method comprises: receiving a mixture of DNA data and additional information; compressing the DNA data to provide compressed DNA data, wherein the compressing comprises encoding the DNA data by using a predefined codeword dictionary that was constructed based upon reference DNA data; and
   selecting out of multiple predefined codeword dictionaries the predefined codeword dictionary, wherein the selecting comprises finding the predefined codeword dictionary that is expected to provide a best match to the DNA data.

3. The method according to claim 1, further comprising storing the compressed DNA data at a storage system.

4. A method for compressing information by a computerized system, the method comprises: receiving a mixture of DNA data and additional information; compressing the DNA data to provide compressed DNA data, wherein the compressing comprises encoding the DNA data by using a predefined codeword dictionary that was constructed based upon reference DNA data; and
   generating location information indicative of a location of DNA data elements and additional information elements within the mixture.

5. The method according to claim 4, comprising:
   processing the location information by applying at least one out of error correction encoding, error detection encoding and compression to provide processed location information; and
   storing the location information at a storage module of a storage system.

6. A method for compressing information by a computerized system, the method comprises: receiving a mixture of DNA data and additional information; compressing the DNA data to provide compressed DNA data, wherein the compressing comprises encoding the DNA data by using a predefined codeword dictionary that was constructed based upon reference DNA data; and
   extracting the DNA data from the mixture by searching for DNA fragment strings.

7. A method for compressing information by a computerized system, the method comprises: receiving a mixture of DNA data and additional information; and compressing the DNA data to provide compressed DNA data, wherein the compressing comprises encoding the DNA data by using a predefined codeword dictionary that was constructed based upon reference DNA data;
   wherein the mixture comprises multiple information strings; and wherein the method comprises concatenating DNA fragment strings from the multiple information strings to provide the DNA data.

8. The method according to claim 7, comprising concatenating DNA fragment strings from at least 100 information strings.

9. A method for compressing information by a computerized system, the method comprises: receiving a mixture of DNA data and additional information; and compressing the DNA data to provide compressed DNA data, wherein the compressing comprises encoding the DNA data by using a predefined codeword dictionary that was constructed based upon reference DNA data;
   wherein the DNA data relates to a first species and the reference DNA data relates to a second species.

10. The method according to claim 9, wherein the first species differs from the second species.

11. The method according to claim 9, wherein the first and second species belong to a same family.

12. The method according to claim 9, wherein the first and second species belong to a same genus.

13. The method according to claim 9, wherein the first and second species belong to a same order.

14. The method according to claim 9, wherein a DNA sequence of the first specie is expected to differ from a DNA sequence of the second sequence by less than a predetermined similarity threshold.

15. A method for compressing information by a computerized system, the method comprises: receiving a mixture of DNA data and additional information; and compressing the DNA data to provide compressed DNA data, wherein the compressing comprises encoding the DNA data by using a predefined codeword dictionary that was constructed based upon reference DNA data;
   wherein the compressing comprises finding a certain DNA fragment string that does not match any codeword of the predefined codeword dictionary; and calculating a certain new codeword representative of the certain DNA fragment string.

16. The method according to claim 15, comprising including the certain new codeword in the DNA data.

17. The method according to claim 15, comprising comparing a length of the certain DNA fragment string to a length of the certain new codeword; and including in the DNA data only a shorter element out of the certain DNA fragment string and the certain new codeword.

18. The method according to claim 15, comprising updating the predefined codeword dictionary by adding the certain new codeword.

19. The method according to claim 15, comprising updating the predefined codeword dictionary by adding the certain new codeword if the certain new codeword is shorter than the certain DNA fragment string and preventing an addition of the certain new codeword if the certain new codeword is longer than the certain DNA fragment string.

20. A method for compressing information by a computerized system, the method comprises: receiving a mixture of DNA data and additional information; compressing the DNA data to provide compressed DNA data, wherein the compressing comprises encoding the DNA data by using a predefined codeword dictionary that was constructed based upon reference DNA data; and
    replacing the predefined codeword dictionary by another predefined codeword dictionary; and storing at a storage system the predefined codeword dictionary and the other predefined codeword dictionary.

21. A method for compressing information by a computerized system, the method comprises: receiving a mixture of DNA data and additional information; compressing the DNA data to provide compressed DNA data, wherein the compressing comprises encoding the DNA data by using a predefined codeword dictionary that was constructed based upon reference DNA data; and
    comparing compression performances of a plurality of predefined codeword dictionaries, and determining to replace the predefined codeword dictionary by another predefined codeword dictionary if it is determined that the other predefined dictionary exhibits better compression performance than the predefined codeword dictionary.

22. A method for compressing information by a computerized system, the method comprises: receiving a mixture of DNA data and additional information; compressing the DNA data to provide compressed DNA data, wherein the compressing comprises encoding the DNA data by using a predefined codeword dictionary that was constructed based upon reference DNA data; and
    comparing compression ratios obtained by applying different predefined codeword dictionaries; and selecting a predefined codeword dictionary that exhibits a best compression ratio.

23. A method for compressing information by a computerized system, the method comprises: receiving a mixture of DNA data and additional information; compressing the DNA data to provide compressed DNA data, wherein the compressing comprises encoding the DNA data by using a predefined codeword dictionary that was constructed based upon reference DNA data; and
    storing at a storage system the compressed DNA data, the additional information and location information indicative of a location of DNA data elements and additional information elements within the mixture.

24. The method according to claim 23, comprising storing at least one of the additional information and the location information at a first logical address space and storing the compressed DNA data at a second logical address space.

25. The method according to claim 23, comprising storing the additional information, the location information and the compressed DNA data at different logical address spaces.

26. The method according to claim 23, comprising storing the additional information, the location information and the compressed DNA data at proximate logical address spaces.

27. A method for compressing information by a computerized system, the method comprises: receiving a mixture of DNA data and additional information; compressing the DNA data to provide compressed DNA data, wherein the compressing comprises encoding the DNA data by using a predefined codeword dictionary that was constructed based upon reference DNA data;
    receiving a request to retrieve the mixture; decrypting the compressed DNA data to provide the DNA data; and reconstructing the mixture by using location information indicative of a location of DNA data elements and additional information elements within the mixture.

28. A method for compressing information by a computerized system, the method comprises: receiving a mixture of DNA data and additional information; compressing the DNA data to provide compressed DNA data, wherein the compressing comprises encoding the DNA data by using a predefined codeword dictionary that was constructed based upon reference DNA data; and
    building the predefined codeword dictionary by traversing the reference DNA data, each time extending a lookup table that forms the predefined codeword dictionary, adding codewords of variable length.

29. The method according to claim 28 wherein the building of the predefined codeword dictionary is not responsive to a number of times a prefix of a codeword appears in the predefined codeword dictionary.

30. A non-transitory computer readable medium, that stores instructions for:
    receiving a mixture of DNA data and additional information;
    compressing the DNA data to provide compressed DNA data, wherein the compressing comprises encoding the DNA data by using a predefined codeword dictionary that was constructed based upon reference DNA data; and
    selecting, out of multiple predefined codeword dictionaries, the predefined codeword dictionary used for compressing the DNA data based upon an expected resemblance between the DNA data and the reference DNA data.

31. A computerized system, comprising:
    an communication module arranged to receive a mixture of DNA data and additional information; and
    a genetic data processor arranged to (a) compress the DNA data to provide compressed DNA, wherein the compressing comprises encoding the DNA data by using a predefined codeword dictionary that was constructed based upon reference DNA data; and (b) selecting, out of multiple predefined codeword dictionaries, the predefined codeword dictionary used for compressing the DNA data based upon an expected resemblance between the DNA data and the reference DNA data.

32. The computerized system according to claim 31 that comprises a storage module for storing the compressed DNA data.

* * * * *